United States Patent [19]
Weinberger

[11] 4,001,729
[45] Jan. 4, 1977

[54] FM TO AM CONVERTER
[75] Inventor: Howard L. Weinberger, Marina del Rey, Calif.
[73] Assignee: Hughes Aircraft Company, Culver City, Calif.
[22] Filed: Mar. 31, 1975
[21] Appl. No.: 563,888
[52] U.S. Cl. .................................. 332/1; 325/316; 332/41
[51] Int. Cl.² ......................................... H03C 1/50
[58] Field of Search ................. 332/1, 41; 325/315, 325/316, 317

[56] References Cited
UNITED STATES PATENTS
2,347,398  4/1944  Crosby ................................. 332/1
3,348,168  10/1967  Melchior et al. ...................... 332/1

Primary Examiner—John Kominski
Attorney, Agent, or Firm—Noel B. Hammond; W. H. MacAllister

[57] ABSTRACT

An FM to AM converter which utilizes a source of unmodulated radio frequency energy, two mixers, and a filter to convert an FM signal to an AM signal. The incoming FM signal is mixed with the unmodulated RF energy. The mixed signal is then passed through a filter to generate AM on the mixed signal together with the FM. The amplitude modulated mixed signal is then mixed with the original FM signal to trip off the FM from the amplitude modulated mixed signal thereby generating an AM signal.

7 Claims, 3 Drawing Figures

“4,001,729”

FM TO AM CONVERTER

FIELD OF THE INVENTION

This device relates to communication systems and more particularly to means for converting FM to AM.

DESCRIPTION OF THE PRIOR ART

When using a communications satellite as part of the overall communication system, it is frequently necessary to transmit signals via the satellite's FM transponder which are ultimately utilized by amplitude modulation receivers. Therefore, at some point in time after passing through the transponder but before reaching the ultimate user, the signal must be converted from FM to AM. There is a similar problem, but to a lesser extent, in terrestrial microwave links.

Accordingly, it is necessary to provide means for making this conversion. Presently, the conversion is performed by demodulating the FM signal and remodulating a new RF carrier. This is not a desirable means because it requires several pieces of complex electronic equipment and is therefore expensive.

Accordingly, it is a general object of the present invention to provide a means for converting an FM signal to an AM signal without demodulating and/or remodulating the signal.

It is another object of the present invention to provide a means for converting an FM signal to an AM signal which requires a small number of parts.

It is yet another object of the present invention to provide a means for converting an FM signal to an AM signal which is relatively inexpensive.

SUMMARY OF THE INVENTION

In keeping with the principles of the present invention, the objects are accomplished with the unique combination of a source of RF energy, two mixers and a filter. The incoming FM signal is mixed with the RF energy of substantially lower magnitude than the FM signal. The mixer output signal at the difference frequency is then passed through the filter. Since the filter is of the type that has a voltage attenuation which varies linearly from zero (0) to unity (1) across the frequency band corresponding to the expected maximum frequency deviation of the FM signal, the output is amplitude modulated in addition to retaining the original FM. The filter output signal is then mixed with the incoming FM signal. The mixer output signal at the difference frequency is only amplitude modulated.

BRIEF DESCRIPTION OF THE DRAWINGS

The above-mentioned and other features and objects of the present invention will become more apparent by reference to the following description taken in conjunction with the accompanying drawings, wherein like reference numerals denote like elements and in which.

DESCRIPTION OF THE PREFERRED EMBODIMENT

Figure 1:
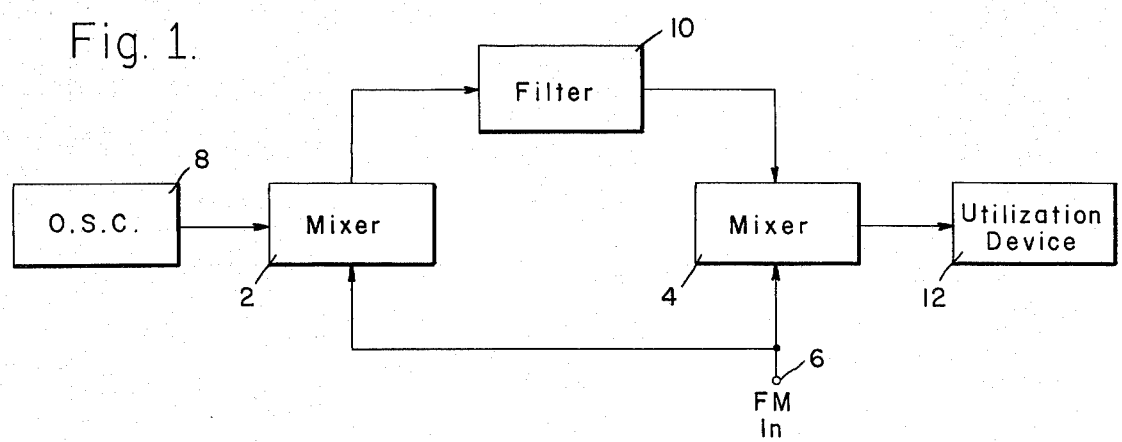
FIG. 1 is a block diagram of an FM to AM converter in accordance with the teachings of the present invention.

Referring more specifically to the drawings, FIG. 1 is a block diagram of an FM to AM converter in accordance with the teachings of the present invention. The FM to AM converter comprises two mixers 2 and 4 each having at least two inputs and an output. An input frequency modulated signal 6 is coupled to first inputs of both mixers 2 and 4. The output of oscillator 8 is coupled to a second input of mixer 2. The output of mixer 2 is coupled to the input of filter 10. Filter 10 is of the type having a transmission characteristic which varies linearly from substantially zero to substantially unity across the frequency band corresponding to the expected maximum frequency deviation of the FM signal 6 while exhibiting a constant phase shift. The output of filter 10 is coupled to the second input of mixer 4. The output of mixer 4 is coupled to utilization device 12.

In practice, filter 10 can be a bandpass filter wherein the frequency of operation is on the linear portion of the slope of the filter skirt. Also, utilization device 12 can be a television receiver or an amplifier or combination of both.

In operation, FM signal 6 is heterodyned in mixer 2 with an unmodulated radio frequency signal generated by oscillator 8. The signal from oscillator 8 is at the desired output frequency of the FM to AM converter and is of substantially lower amplitude than FM signal 6. The difference frequency signal from mixer 2 passes through filter 10. If the output of oscillator 8 is adjusted so that it is substantially lower in magnitude than that of the FM signal 6, the difference signal has a substantially constant amplitude independent of receiver noise that may accompany signal 6. Since filter 10 is of the type whose transmission characteristic varies from substantially zero to substantially unity across the desired frequency band, the output signal of filter 10 is amplitude modulated in addition to retaining the original frequency modulation.

The dual modulated output signal from filter 10 is heterodyned in mixer 4 with the original FM input signal 6 and the difference frequency selected thereby wiping off the FM portion of the dual modulated output signal and generating a purely amplitude modulated signal at the same frequency as the oscillator 8 output signal. The amplitude modulated signal from mixer 4 is a dual sideband amplitude modulated signal. The amplitude modulated signal from mixer 4 is coupled to some utilization device 12. If the utilization device 12 is a television receiver, it may be necessary in areas having a high density of television channels to pass the double sideband signal through a vestigial filter to eliminate the unwanted sideband. Furthermore, if filter 10 introduces a substantial delay, a compensating delay can be inserted between the FM signal 6 and mixer 4.

Figure 2:
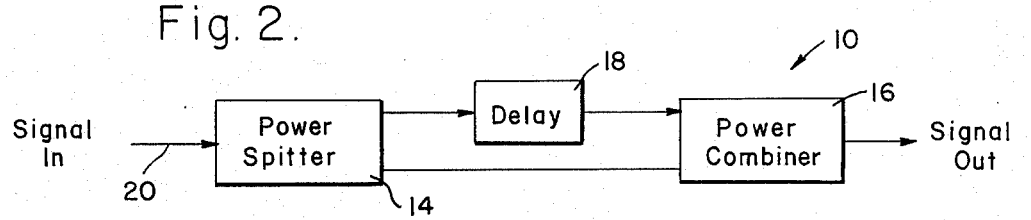
FIG. 2 is a block diagram of a representative filter suitable for the FM to AM converter of FIG. 1.

FIG. 2 is a block diagram of a representative implementation of filter 10. The block diagram of FIG. 2 comprises a signal splitter 14 having at least one input and two outputs and a signal combiner 16 having at least two inputs and one output. One output of splitter 14 is coupled to an input of combiner 16. The other output of splitter 14 is coupled to one end of delay network 18. The other end of delay network 18 is coupled to the other input of combiner 16. A radio frequency modulated signal 20 is coupled to the input of splitter 14. The input of filter 10 comprises the input of splitter 14.

In operation, the input signal 20 to the filter 10 is split into two signals by splitter 14. Combiner 16 reconstitutes the two signals after one of the two signals has been delayed in time by delay network 18 into a single output signal. Since the two signals have traversed different delays, the resulting frequency response characteristic of the combination of splitter 14, delay network 18, and combiner 16 has the form of a full-wave rectified sine wave having cusps corresponding to odd integral multiples of 180° phase difference between the two signals. Therefore, in order to have a filter 10 with the desired linear amplitude/frequency response, the delay network 18 is chosen relative to the frequency of signal 20 so that operation is immediately to one side of a cusp in the frequency response characteristic.

In practice, if the delay is substantially equal to one divided by twice the frequency deviation of signal 20 and the frequency of signal 20 is 5.28 times the frequency deviation of signal 20, a practical compromise between good FM to AM conversion, linearity, and high AM output is achieved.

Figure 3:
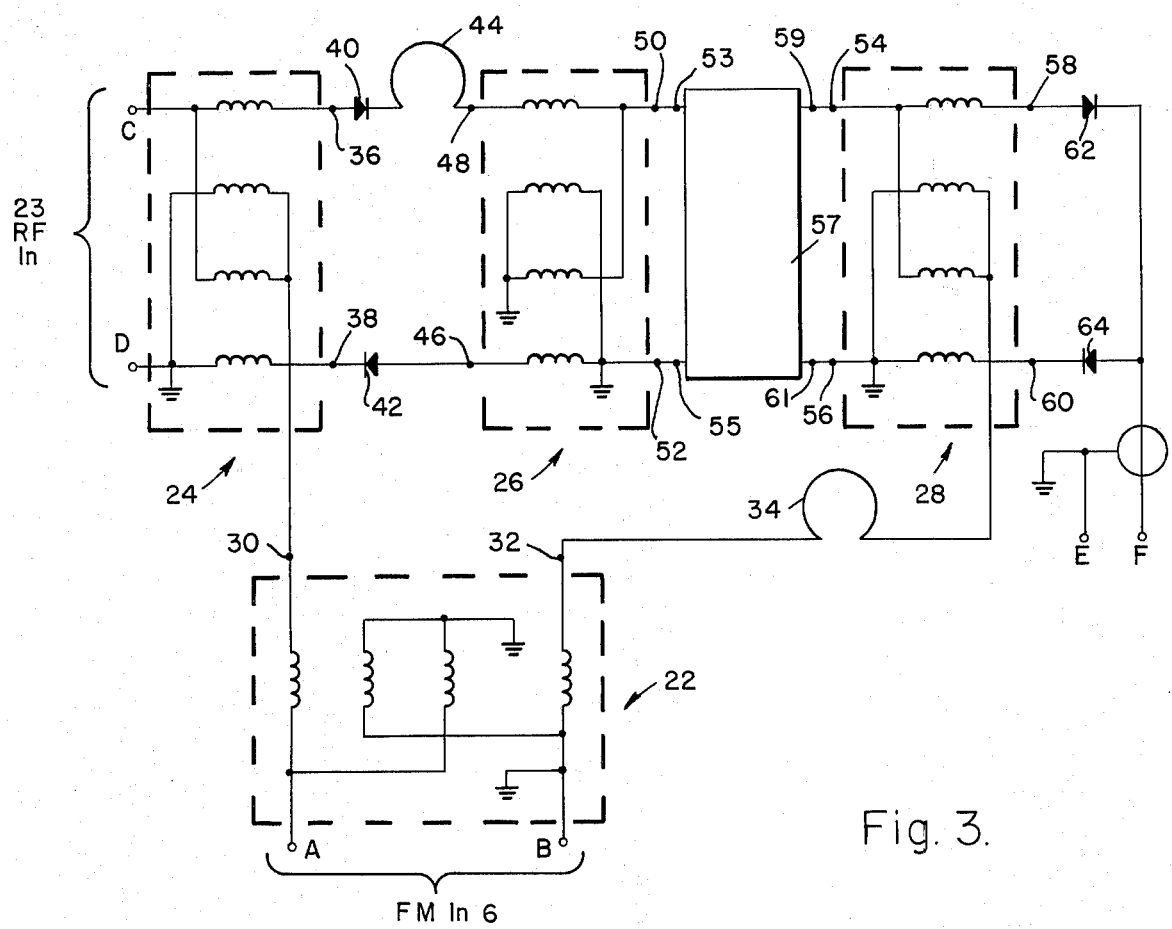
FIG. 3 is a schematic diagram of an FM to AM converter in accordance with the teachings of the present invention.

In FIG. 3 there is shown a schematic diagram of a specific implementation of FM to AM converter of FIG. 1. The circuit of FIG. 3 comprises four seventy-five ohm to three hundred ohm balun transformers 22, 24, 26 and 28 each of which can comprise bifilar wound transformers. The input frequency modulated signal 6 is coupled to the 75 $\omega$ input of balun transformer 22 defined by terminals A and B. Terminals 30 and 32 of the 300 $\omega$ output of balun 22 are connected respectively to the center tap of the bifilar winding of balun 24 and to one end of delay network 34. Terminal A and the counter tap of the bifilar winding of balun 22 are grounded.

A radio frequency signal 23 from oscillator 8 is coupled to the 75 $\omega$ input of balun 24 defined by terminals C and D. Terminals 36 and 38 of balun 24 are coupled respectively to the anode of mixer diode 40 and the cathode of mixer diode 42. Terminals 36 and 38 define the 300 $\omega$ output of balun 24. The cathode of diode 40 and the anode of diode 42 are coupled respectively to one end of delay network 44 and terminal 46 of balun 26. Terminal D of balun 24 is grounded.

The opposite end of delay network 44 is coupled to terminal 48 of balun 26. Terminals 46 and 48 of balun 26 define the 300 $\omega$ input of balun 26. Terminals 50 and 52 of balun 26 are coupled respectively to terminals 53 and 55 of lowpass filter 57. Terminals 59 and 61 of filter 57 are coupled respectively to terminal 54 and 56 of balun 28. Terminals 50 and 52 define the 75 $\omega$ output of balun 26. The center tap of the bifilar winding of balun 26 and terminal 52 are grounded.

Terminals 58 and 60 of balun 28 are coupled respectively to the anode of mixer diode 62 and the cathode of mixer diode 64. Terminals 54 and 56 and terminals 58 and 60 define respectively the 75 $\omega$ input and 300 $\omega$ output of balun 28. The opposite end of delay 34 is coupled to the center tap of the bifilar winding of balun 28. The cathode of diode 62 and the anode of diode 64 are coupled to terminal E. Terminal F and terminal 56 of balun 28 are grounded. Terminals E and F define the output of the FM to AM converter and are coupled to the utilization device, not shown in FIG. 3.

In practice, the mixer diodes 40, 42, 62 and 64 can be 1N82's. Furthermore, delay networks 34 and 44 can be lengths of coaxial cables. In addition, the cutoff frequency of filter 57 is substantially equal to the difference between the frequency of signal 6 and the frequency of signal 23 plus the deviation of signal 6.

In operation, the frequency modulated signal applied to terminals A and B is split by balun 22 into two signals. One of the two FM signals is coupled to the center tap of the bifilar winding of balun 24. The FM signal at the center tap is split again by balun 24. Furthermore, the double split FM signals are also combined with the radio frequency signal 23 applied to terminals C and D by balun 24, thereby creating two distinct combined signals. The frequency components of the two combined signals are heterodyned by mixer diodes 40 and 42. The difference frequency signal from diode 40 is delayed by delay network 44 and coupled to balun 26. The difference frequency signal from diode 42 is coupled directly to balun 26. The delayed and undelayed difference frequency signals are combined by balun 26.

The slope filter function of filter 10 is performed by the combination of balun 24, delay 44 and balun 26. Since the difference signals traverse different delays through the signal paths between baluns 24 and 26, the resulting frequency response characteristic of the combination has the form of a full-wave rectified sine wave having cups corresponding to odd integral multiples of 180° phase difference between the two signal paths. Therefore, in order to have the desired linear amplitude/frequency relationship, the delay 44 is chosen relative to the operating frequency so that operation is immediately to one side of a cusp in the frequency response characteristic.

The other of the two FM signals from balun 22 is delayed by delay network 34. Delay network 34 is chosen to be half of delay network 44. The delayed FM signal from delay network 34 is coupled to the center tap of the bifilar winding of balun 28 wherein it is combined with the output signal from balun 26. The output signal from balun 26 is a signal having both frequency and amplitude modulated components. The combined signal from balun 28 is heterodyned by the balanced mixer formed by diodes 62 and 64 and the difference frequency signal is selected. Since both of the signals which are heterodyned together contain identical FM components and the output signal at terminals E and F is the difference frequency, the frequency modulated components are wiped off and a purely amplitude modulated signal at the same frequency as that of the unmodulated radio frequency signal 23 appears at terminals E and F.

Since the baluns in FIG. 2 perform signal splitting and signal combining function, it is apparent to one skilled in the art that devices performing similar functions can be substituted for the baluns without departing from the spirit and scope of the invention.

In all cases it is understood that the above-described embodiments are merely illustrative of but a small number of the many possible specific embodiments which represent the application of the principles of the present invention. Furthermore, numerous and varied other arrangements can be readily devised in accordance with the principles of the present invention by those skilled in the art without departing from the spirit and scope of the invention.

What is claimed is:

1. An FM to AM converter comprising, in combination:

first, second, third, and fourth transformers, each of said transformers having primary and center tapped secondary windings;

first non-linear circuit means for coupling the secondary winding of said first transformer to the secondary winding of said second transformer, said second transformer having said center tap of said secondary winding coupled to a common terminal;

first means for coupling said primary winding of said second transformer to the primary winding of said third transformer, said second and third transformers both having one side of said primary winding coupled to said common terminal;

second means for coupling one side of said secondary winding of said fourth transformer to said center tap of said secondary winding of said first transformer;

third means for coupling the other side of said secondary winding of said fourth transformer to said center tap of said secondary winding of said third transformer, said fourth transformer having said center tap of said secondary winding coupled to said common terminal;

fourth means for applying a frequency modulated signal to said primary winding of said fourth transformer, said fourth transformer having one side of said primary winding transformer coupled to said common terminal;

fifth means for applying a radio frequency signal to said primary winding of said first transformer, said fourth transformer having one side of said primary winding coupled to said common terminal; and second non-linear circuit means for extracting an amplitude modulated signal from said secondary of said third transformer.

2. An FM to AM converter according to claim 1 wherein each of said first, second, third, and fourth transformers comprise balun transformers having serially wound bifilar windings.

3. An FM to AM converter according to claim 2 wherein said first non-linear circuit means comprises:
a first mixer diode coupled between one side of each secondary winding of said first and second transformers; and
a serially coupled second mixer diode and first delay network coupled between the other side of each secondary winding of said first and second transformers.

4. An FM to AM converter according to claim 3 wherein said first means comprises a bandpass filter.

5. An FM to AM converter according to claim 4 wherein said second non-linear circuit means comprises at least one mixer diode coupled to said secondary winding of said third transformer.

6. An FM to AM converter according to claim 5 wherein said third means comprises a second delay network.

7. An FM to AM converter according to claim 6 wherein said first and second delay networks comprise lengths of coaxial cable.

* * * * *